United States Patent
Kidd

(10) Patent No.: US 9,583,484 B2
(45) Date of Patent: Feb. 28, 2017

(54) TIPLESS TRANSISTORS, SHORT-TIP TRANSISTORS, AND METHODS AND CIRCUITS THEREFOR

(71) Applicant: Mie Fujitsu Semiconductor Limited, Kuwana, Mie (JP)

(72) Inventor: David A. Kidd, San Diego, CA (US)

(73) Assignee: Mie Fujitsu Semiconductor Limited, Kuwana (JP)

( * ) Notice: Subject to any disclaimer, the term of this patent is extended or adjusted under 35 U.S.C. 154(b) by 0 days.

(21) Appl. No.: 15/179,370

(22) Filed: Jun. 10, 2016

(65) Prior Publication Data

US 2016/0284698 A1    Sep. 29, 2016

Related U.S. Application Data

(60) Continuation of application No. 14/533,414, filed on Nov. 5, 2014, now Pat. No. 9,385,121, which is a
(Continued)

(51) Int. Cl.
*H01L 27/088* (2006.01)
*H01L 29/10* (2006.01)
(Continued)

(52) U.S. Cl.
CPC ........... *H01L 27/088* (2013.01); *G11C 7/08* (2013.01); *H01L 29/1041* (2013.01);
(Continued)

(58) Field of Classification Search
CPC ........... H01L 27/088; H01L 29/1041; H01L 29/7833; G11C 7/08; H03L 7/08; H03K 3/356113
(Continued)

(56) References Cited

U.S. PATENT DOCUMENTS

| 3,958,266 A | 5/1976 | Athanas |
| 4,000,504 A | 12/1976 | Berger |

(Continued)

FOREIGN PATENT DOCUMENTS

| EP | 0274278 A | 7/1988 |
| JP | 59193066 A1 | 1/1984 |

(Continued)

OTHER PUBLICATIONS

Abiko. H et al.. "A Channel Engineering Combined with Channel Epitaxy Optimization and TED Suppression for 0.15μm n-n Gate CMOS Technology", 1995 Symposium on VLSI Technology Digest of Technical Papers, 1995, pp. 23-24.

(Continued)

*Primary Examiner* — Nathan W Ha
(74) *Attorney, Agent, or Firm* — Baker Botts L.L.P.

(57) ABSTRACT

An integrated circuit can include a plurality of first transistors formed in a substrate and having gate lengths of less than one micron and at least one tipless transistor formed in the substrate and having a source-drain path coupled between a circuit node and a first power supply voltage. In addition or alternatively, an integrated circuit can include minimum feature size transistors; a signal driving circuit comprising a first transistor of a first conductivity type having a source-drain path coupled between a first power supply node and an output node, and a second transistor of a second conductivity type having a source-drain path coupled between a second power supply node and the output node, and a gate coupled to a gate of the first transistor, wherein the first or second transistor is a tipless transistor.

11 Claims, 6 Drawing Sheets

Related U.S. Application Data division of application No. 13/708,983, filed on Dec. 8, 2012, now Pat. No. 8,895,327.

(60) Provisional application No. 61/569,038, filed on Dec. 9, 2011.

(51) Int. Cl.

| | | |
|---|---|---|
| *H01L 29/78* | (2006.01) | |
| *G11C 7/08* | (2006.01) | |
| *H03K 5/06* | (2006.01) | |
| *H03K 3/356* | (2006.01) | |
| *H03L 7/08* | (2006.01) | |

(52) U.S. Cl.
CPC .... *H01L 29/7833* (2013.01); *H03K 3/356113* (2013.01); *H03K 5/06* (2013.01); *H03L 7/08* (2013.01)

(58) Field of Classification Search
USPC .................................................. 257/335, 355
See application file for complete search history.

(56) References Cited

U.S. PATENT DOCUMENTS

| | | |
|---|---|---|
| 4,021,835 A | 5/1977 | Etoh |
| 4,242,691 A | 12/1980 | Kotani |
| 4,276,095 A | 6/1981 | Beilstein, Jr. |
| 4,315,781 A | 2/1982 | Henderson |
| 4,578,128 A | 3/1986 | Mundt |
| 4,617,066 A | 10/1986 | Vasudev |
| 4,761,384 A | 8/1988 | Neppl |
| 4,819,043 A | 4/1989 | Yazawa |
| 5,034,337 A | 7/1991 | Mosher |
| 5,144,378 A | 9/1992 | Hikosaka |
| 5,156,989 A | 10/1992 | Williams |
| 5,156,990 A | 10/1992 | Mitchell |
| 5,166,765 A | 11/1992 | Lee |
| 5,208,473 A | 5/1993 | Komori |
| 5,298,763 A | 3/1994 | Shen |
| 5,369,288 A | 11/1994 | Usuki |
| 5,384,476 A | 1/1995 | Nishizawa |
| 5,559,368 A | 9/1996 | Hu |
| 5,608,253 A | 3/1997 | Liu |
| 5,663,583 A | 9/1997 | Matloubian |
| 5,712,501 A | 1/1998 | Davies |
| 5,719,422 A | 2/1998 | Burr |
| 5,726,488 A | 3/1998 | Watanabe |
| 5,763,921 A | 6/1998 | Okumura |
| 5,780,899 A | 7/1998 | Hu |
| 5,847,419 A | 12/1998 | Imai |
| 5,856,003 A | 1/1999 | Chiu |
| 5,861,334 A | 1/1999 | Rho |
| 5,877,049 A | 3/1999 | Liu |
| 5,889,315 A | 3/1999 | Farrenkopf |
| 5,895,954 A | 4/1999 | Yasumura |
| 5,903,027 A | 5/1999 | Yoshitomi |
| 5,923,987 A | 7/1999 | Burr |
| 5,989,963 A | 11/1999 | Luning |
| 6,020,227 A | 2/2000 | Bulucea |
| 6,087,210 A | 7/2000 | Sohn |
| 6,087,691 A | 7/2000 | Hamamoto |
| 6,096,611 A | 8/2000 | Wu |
| 6,103,562 A | 8/2000 | Son |
| 6,121,153 A | 9/2000 | Kikkawa |
| 6,147,383 A | 11/2000 | Kuroda |
| 6,157,073 A | 12/2000 | Lehongres |
| 6,175,582 B1 | 1/2001 | Naito |
| 6,184,112 B1 | 2/2001 | Maszara |
| 6,190,979 B1 | 2/2001 | Radens |
| 6,194,259 B1 | 2/2001 | Nayak |
| 6,218,895 B1 | 4/2001 | De |
| 6,229,188 B1 | 5/2001 | Aoki |
| 6,245,618 B1 | 6/2001 | An |
| 6,288,429 B1 | 9/2001 | Iwata |
| 6,300,177 B1 | 10/2001 | Sundaresan |
| 6,313,489 B1 | 11/2001 | Letavic |
| 6,320,222 B1 | 11/2001 | Forbes |
| 6,326,666 B1 | 12/2001 | Bernstein |
| 6,358,806 B1 | 3/2002 | Puchner |
| 6,380,019 B1 | 4/2002 | Yu |
| 6,391,752 B1 | 5/2002 | Colinge |
| 6,426,279 B1 | 7/2002 | Huster |
| 6,444,550 B1 | 9/2002 | Hao |
| 6,444,551 B1 | 9/2002 | Ku |
| 6,461,920 B1 | 10/2002 | Shirahata |
| 6,461,928 B2 | 10/2002 | Rodder |
| 6,472,278 B1 | 10/2002 | Marshall |
| 6,482,714 B1 | 11/2002 | Hieda |
| 6,489,224 B1 | 12/2002 | Burr |
| 6,492,232 B1 | 12/2002 | Tang |
| 6,500,739 B1 | 12/2002 | Wang |
| 6,503,801 B1 | 1/2003 | Rouse |
| 6,506,640 B1 | 1/2003 | Ishida |
| 6,518,623 B1 | 2/2003 | Oda |
| 6,534,373 B1 | 3/2003 | Yu |
| 6,541,829 B2 | 4/2003 | Nishinohara |
| 6,548,842 B1 | 4/2003 | Bulucea |
| 6,551,885 B1 | 4/2003 | Yu |
| 6,573,129 B2 | 6/2003 | Hoke |
| 6,600,200 B1 | 7/2003 | Lustig |
| 6,620,671 B1 | 9/2003 | Wang |
| 6,624,488 B1 | 9/2003 | Kim |
| 6,630,710 B1 | 10/2003 | Augusto |
| 6,660,605 B1 | 12/2003 | Liu |
| 6,667,200 B2 | 12/2003 | Sohn |
| 6,670,260 B1 | 12/2003 | Yu |
| 6,693,333 B1 | 2/2004 | Yu |
| 6,730,568 B2 | 5/2004 | Sohn |
| 6,737,724 B2 | 5/2004 | Hieda |
| 6,743,291 B2 | 6/2004 | Ang |
| 6,753,230 B2 | 6/2004 | Sohn |
| 6,770,944 B2 | 8/2004 | Nishinohara |
| 6,787,424 B1 | 9/2004 | Yu |
| 6,797,994 B1 | 9/2004 | Hoke |
| 6,808,994 B1 | 10/2004 | Wang |
| 6,821,825 B2 | 11/2004 | Todd |
| 6,822,297 B2 | 11/2004 | Nandakumar |
| 6,831,292 B2 | 12/2004 | Currie |
| 6,881,641 B2 | 4/2005 | Wieczorek |
| 6,881,987 B2 | 4/2005 | Sohn |
| 6,893,947 B2 | 5/2005 | Martinez |
| 6,916,698 B2 | 7/2005 | Mocuta |
| 6,930,007 B2 | 8/2005 | Bu |
| 6,930,360 B2 | 8/2005 | Yamauchi |
| 6,963,090 B2 | 11/2005 | Passlack |
| 7,002,214 B1 | 2/2006 | Boyd |
| 7,008,836 B2 | 3/2006 | Algotsson |
| 7,013,359 B1 | 3/2006 | Li |
| 7,015,546 B2 | 3/2006 | Herr |
| 7,057,216 B2 | 6/2006 | Ouyang |
| 7,061,058 B2 | 6/2006 | Chakravarthi |
| 7,064,039 B2 | 6/2006 | Liu |
| 7,064,399 B2 | 6/2006 | Babcock |
| 7,071,103 B2 | 7/2006 | Chan |
| 7,078,325 B2 | 7/2006 | Curello |
| 7,078,776 B2 | 7/2006 | Nishinohara |
| 7,089,515 B2 | 8/2006 | Hanafi |
| 7,119,381 B2 | 10/2006 | Passlack |
| 7,170,120 B2 | 1/2007 | Datta |
| 7,186,598 B2 | 3/2007 | Yamauchi |
| 7,189,627 B2 | 3/2007 | Wu |
| 7,199,430 B2 | 4/2007 | Babcock |
| 7,202,517 B2 | 4/2007 | Dixit |
| 7,211,871 B2 | 5/2007 | Cho |
| 7,221,021 B2 | 5/2007 | Wu |
| 7,223,646 B2 | 5/2007 | Miyashita |
| 7,226,833 B2 | 6/2007 | White |
| 7,226,843 B2 | 6/2007 | Weber |
| 7,235,822 B2 | 6/2007 | Li |
| 7,294,877 B2 | 11/2007 | Rueckes |
| 7,297,994 B2 | 11/2007 | Wieczorek |
| 7,301,208 B2 | 11/2007 | Handa |

(56) References Cited

U.S. PATENT DOCUMENTS

| | | |
|---|---|---|
| 7,304,350 B2 | 12/2007 | Misaki |
| 7,312,500 B2 | 12/2007 | Miyashita |
| 7,323,754 B2 | 1/2008 | Ema |
| 7,332,439 B2 | 2/2008 | Lindert |
| 7,348,629 B2 | 3/2008 | Chu |
| 7,354,833 B2 | 4/2008 | Liaw |
| 7,427,788 B2 | 9/2008 | Li |
| 7,442,971 B2 | 10/2008 | Wirbeleit |
| 7,462,908 B2 | 12/2008 | Bal |
| 7,485,536 B2 | 2/2009 | Jin |
| 7,491,988 B2 | 2/2009 | Tolchinsky |
| 7,494,861 B2 | 2/2009 | Chu |
| 7,498,637 B2 | 3/2009 | Yamaoka |
| 7,501,324 B2 | 3/2009 | Babcock |
| 7,507,999 B2 | 3/2009 | Kusumoto |
| 7,521,323 B2 | 4/2009 | Surdeanu |
| 7,531,393 B2 | 5/2009 | Doyle |
| 7,538,412 B2 | 5/2009 | Schulze |
| 7,564,105 B2 | 7/2009 | Chi |
| 7,592,241 B2 | 9/2009 | Takao |
| 7,598,142 B2 | 10/2009 | Ranade |
| 7,605,041 B2 | 10/2009 | Ema |
| 7,605,060 B2 | 10/2009 | Meunier-Beillard |
| 7,605,429 B2 | 10/2009 | Bernstein |
| 7,608,496 B2 | 10/2009 | Chu |
| 7,615,802 B2 | 11/2009 | Elpelt |
| 7,622,341 B2 | 11/2009 | Chudzik |
| 7,642,140 B2 | 1/2010 | Bae |
| 7,645,665 B2 | 1/2010 | Kubo |
| 7,651,920 B2 | 1/2010 | Siprak |
| 7,655,523 B2 | 2/2010 | Babcock |
| 7,675,126 B2 | 3/2010 | Cho |
| 7,678,638 B2 | 3/2010 | Chu |
| 7,681,628 B2 | 3/2010 | Joshi |
| 7,682,887 B2 | 3/2010 | Dokumaci |
| 7,683,442 B1 | 3/2010 | Burr |
| 7,696,000 B2 | 4/2010 | Liu |
| 7,704,844 B2 | 4/2010 | Zhu |
| 7,709,828 B2 | 5/2010 | Braithwaite |
| 7,723,750 B2 | 5/2010 | Zhu |
| 7,750,405 B2 | 7/2010 | Nowak |
| 7,750,682 B2 | 7/2010 | Bernstein |
| 7,755,146 B2 | 7/2010 | Helm |
| 7,759,714 B2 | 7/2010 | Itoh |
| 7,795,677 B2 | 9/2010 | Bangsaruntip |
| 7,818,702 B2 | 10/2010 | Mandelman |
| 7,829,402 B2 | 11/2010 | Matocha |
| 7,867,835 B2 | 1/2011 | Lee |
| 7,883,977 B2 | 2/2011 | Babcock |
| 7,888,747 B2 | 2/2011 | Hokazono |
| 7,897,495 B2 | 3/2011 | Ye |
| 7,906,413 B2 | 3/2011 | Cardone |
| 7,906,813 B2 | 3/2011 | Kato |
| 7,919,791 B2 | 4/2011 | Flynn |
| 7,948,008 B2 | 5/2011 | Liu |
| 7,952,147 B2 | 5/2011 | Ueno |
| 7,960,232 B2 | 6/2011 | King |
| 7,960,238 B2 | 6/2011 | Kohli |
| 7,968,400 B2 | 6/2011 | Cai |
| 7,968,411 B2 | 6/2011 | Williford |
| 8,004,024 B2 | 8/2011 | Furukawa |
| 8,012,827 B2 | 9/2011 | Yu |
| 8,039,332 B2 | 10/2011 | Bernard |
| 8,048,791 B2 | 11/2011 | Hargrove |
| 8,048,810 B2 | 11/2011 | Tsai |
| 8,067,279 B2 | 11/2011 | Sadra |
| 8,105,891 B2 | 1/2012 | Yeh |
| 8,106,424 B2 | 1/2012 | Schruefer |
| 8,106,481 B2 | 1/2012 | Rao |
| 8,119,482 B2 | 2/2012 | Bhalla |
| 8,120,069 B2 | 2/2012 | Hynecek |
| 8,129,246 B2 | 3/2012 | Babcock |
| 8,129,797 B2 | 3/2012 | Chen |
| 8,134,159 B2 | 3/2012 | Hokazono |
| 8,143,120 B2 | 3/2012 | Kerr |
| 8,143,124 B2 | 3/2012 | Challa |
| 8,143,678 B2 | 3/2012 | Kim |
| 8,148,774 B2 | 4/2012 | Mori |
| 8,163,619 B2 | 4/2012 | Yang |
| 8,173,502 B2 | 5/2012 | Yan |
| 8,178,430 B2 | 5/2012 | Kim |
| 8,183,096 B2 | 5/2012 | Wirbeleit |
| 8,183,107 B2 | 5/2012 | Mathur |
| 8,236,661 B2 | 8/2012 | Dennard |
| 2001/0014495 A1 | 8/2001 | Yu |
| 2003/0122203 A1 | 7/2003 | Nishinohara |
| 2003/0183856 A1 | 10/2003 | Wieczorek |
| 2004/0041201 A1* | 3/2004 | Sugiyama ......... H01L 23/49844 257/316 |
| 2004/0075118 A1 | 4/2004 | Heinemann |
| 2004/0084731 A1 | 5/2004 | Matsuda |
| 2005/0116282 A1 | 6/2005 | Pattanayak |
| 2005/0151166 A1 | 7/2005 | Lin |
| 2005/0250289 A1 | 11/2005 | Babcock |
| 2006/0022270 A1 | 2/2006 | Boyd |
| 2006/0049464 A1 | 3/2006 | Rao |
| 2006/0068555 A1 | 3/2006 | Zhu |
| 2006/0068586 A1 | 3/2006 | Pain |
| 2006/0071278 A1 | 4/2006 | Takao |
| 2006/0154428 A1 | 7/2006 | Dokumaci |
| 2006/0175633 A1* | 8/2006 | Kinzer ............... H01L 27/0605 257/192 |
| 2006/0202742 A1* | 9/2006 | Aksin ................. G11C 27/024 327/536 |
| 2007/0040222 A1 | 2/2007 | Van Camp |
| 2007/0158790 A1 | 7/2007 | Rao |
| 2007/0238253 A1 | 10/2007 | Tucker |
| 2008/0067589 A1 | 3/2008 | Ito |
| 2008/0169493 A1 | 7/2008 | Lee |
| 2008/0197439 A1 | 8/2008 | Goerlach |
| 2008/0227250 A1 | 9/2008 | Ranade |
| 2008/0258198 A1 | 10/2008 | Bojarczuk |
| 2008/0272409 A1 | 11/2008 | Sonkusale |
| 2009/0057746 A1 | 3/2009 | Sugll |
| 2009/0108350 A1 | 4/2009 | Cai |
| 2009/0134468 A1 | 5/2009 | Tsuchiya |
| 2009/0302388 A1 | 12/2009 | Cai |
| 2009/0311837 A1 | 12/2009 | Kapoor |
| 2009/0321849 A1 | 12/2009 | Miyamura |
| 2010/0012988 A1 | 1/2010 | Yang |
| 2010/0038724 A1 | 2/2010 | Anderson |
| 2010/0187641 A1 | 7/2010 | Zhu |
| 2011/0073961 A1 | 3/2011 | Dennard |
| 2011/0074498 A1 | 3/2011 | Thompson |
| 2011/0079860 A1 | 4/2011 | Verhulst |
| 2011/0079861 A1 | 4/2011 | Shifren |
| 2011/0169082 A1 | 7/2011 | Zhu |
| 2011/0175170 A1 | 7/2011 | Wang |
| 2011/0180880 A1 | 7/2011 | Chudzik |
| 2011/0193164 A1 | 8/2011 | Zhu |
| 2012/0021594 A1 | 1/2012 | Gurtej |
| 2012/0056275 A1 | 3/2012 | Cai |
| 2012/0108050 A1 | 5/2012 | Chen |
| 2012/0190177 A1 | 7/2012 | Kim |

FOREIGN PATENT DOCUMENTS

| | | |
|---|---|---|
| JP | 4186774 A1 | 3/1992 |
| JP | 8288508 A1 | 1/1996 |
| JP | 8153873 A1 | 6/1996 |
| JP | 2004087671 A1 | 3/2004 |
| WO | 2011062788 A1 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content Si1-yCy Channel", 2006, ECS 210th Meeting, Abstract 1033.

(56) References Cited

OTHER PUBLICATIONS

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Laveant, P. "Incorporation, Diffusion and Agglomeration of Carbon in Silicon", 2002, Solid State Phenomena, vols. 82-84, pp. 189-194.

Noda, Ket al., "A 0.1-μm Delta-Doped MOSFET Fabricated with Post-Low-Energy Implanting Selective Epitaxy", Apr. 1998, IEEE Transactions on Electron Devices, vol. 45, No. 4, pp. 809-814.

Ohguro, T et al., "An 0.18-μm CMOS for Mixed Digital and Analog Applications with Zero-Volt-Vth Epitaxial-Channel MOSFET's", Jul. 1999, IEEE Transactions on Electron Devices, vol. 46, No. 7, pp. 1378-1383.

Pinacho, R et al., "Carbon in Silicon: Modeling of Diffusion and Clustering Mechanisms", Aug. 2002, Journal of Applied Physics, vol. 92, No. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999, Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

Thompson, Set al., "MOS Scaling: Transistor Challenges for the 21st Century", 1998, Intel Technology Journal 03' 1998, pp. 1-19.

Wann, C. et al., "Channel Profile Optimization and Device Design for Low-Power High-Performance Dynamic-Threshold MOSFET", 1996, IEDM 96, pp. 113-116.

Werner, Pet al., "Carbon Diffusion in Silicon", Oct. 1998, Applied Physics Letters, vol. 73, No. 17, pp. 2465-24672.

Yan, Ran-Hong et al., "Scaling the SiMOSFET: From Bulk to SOI to Bulk", Jul. 1992, IEEE Transactions on Electron Devices, vol. 39, No. 7.

\* cited by examiner

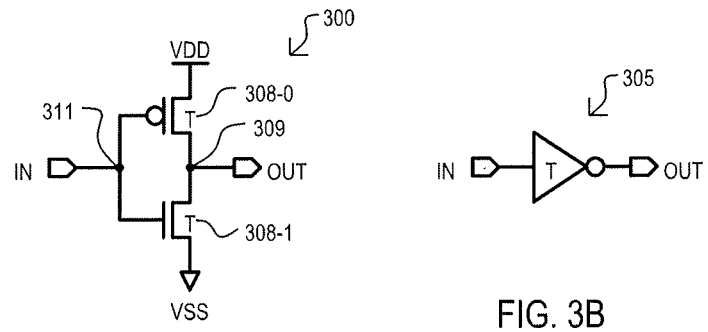
FIG. 3A
FIG. 3B
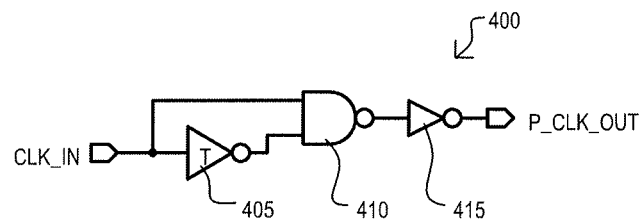
FIG. 4A
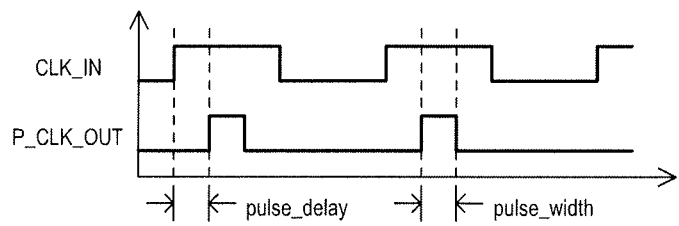
FIG. 4B
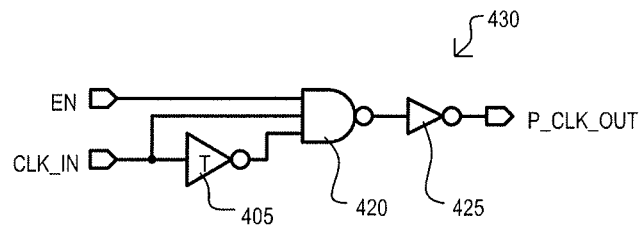
FIG. 4C (BACKGROUND)

TIPLESS TRANSISTORS, SHORT-TIP TRANSISTORS, AND METHODS AND CIRCUITS THEREFOR

CROSS-REFERENCE TO RELATED APPLICATIONS

This application is a continuation of U.S. application Ser. No. 14/533,414 filed Nov. 5, 2014 and entitled "Tipless Transistors, Short-Tip Transistors, and Methods and Circuits Therefor" which is a divisional of 13/708,983 filed Dec. 8, 2012 and entitled "Tipless Transistors, Short-Tip Transistors, and Methods and Circuits Therefor" which claims the benefit of Provisional Application Ser. No. 61/569,038, filed on Dec. 9, 2011, the contents all of which are incorporated by reference herein, in their entirety.

TECHNICAL FIELD

The present invention relates generally to integrated circuit, and more particularly to integrated circuits formed with tipless transistors that do not include source and/or drain extensions that extend into a channel region below a control gate and/or that include short-tip transistors.

BACKGROUND

As transistor sizes have decreased, transistor performance has suffered from "short-channel" effects. Some short-channel effects, such as drain-induced barrier lowering, can arise from depletion regions created by the source-drain diffusions. Accordingly, at smaller transistor channel sizes, conventional integrated circuit devices can include transistors with source and drain extensions (SDEs) that extend laterally (with respect to the substrate surface) into channel regions, under a gate electrode. Drain and source extensions are typically formed with "halo" or "tip" ion implantation steps.

BRIEF DESCRIPTION OF THE DRAWINGS

FIGS. 3A and 3B show tipless inverter circuits according to embodiments.

FIGS. 4A to 4C show a tipless pulse generator circuits according to embodiments.

DETAILED DESCRIPTION

Various embodiments of the present invention will now be described in detail with reference to a number of drawings. The embodiments show integrated circuits that can include transistors of relatively small channel size, while at the same time utilizing "tipless" or "short-tip" transistors for various functions in the integrated circuit device. Tipless transistors can include source and drain vertical doping profiles that do not include extension regions that extend in a lateral direction under a gate electrode. Short-tip transistors can include extension regions that are shorter than those of other transistors in the same integrated circuit device.

Figure 1A:
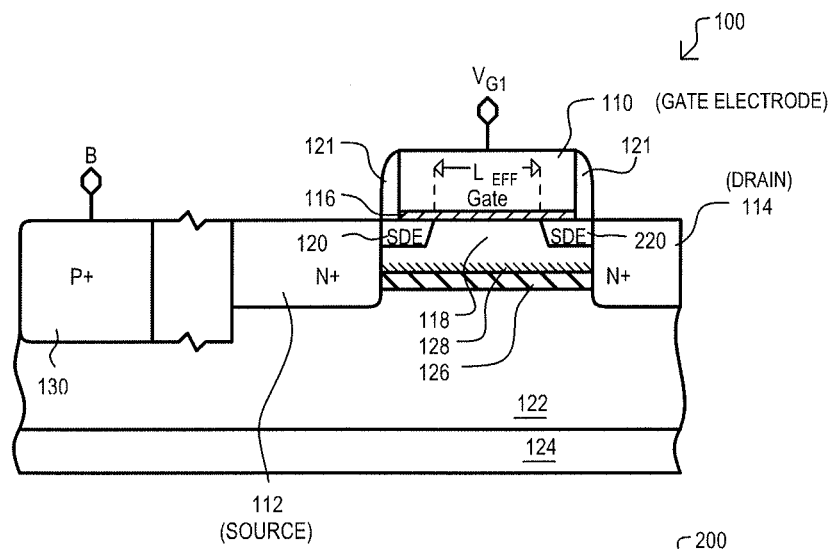
FIG. 1A shows a Deeply Depleted Channel (DDC) transistor.

FIG. 1A shows an embodiment of a deeply depleted channel (DDC) transistor 100 having an enhanced body coefficient, along with the ability to set threshold voltage Vt with enhanced precision, according to certain described embodiments. The DDC transistor 100 includes a gate electrode 110, source 112, drain 114, and a gate dielectric 116 positioned over a substantially undoped channel 118. Lightly doped source and drain extensions (SDE) 120, positioned respectively adjacent to source 112 and drain 114, extend toward each other, setting the transistor channel length (LG). In the embodiment shown, insulating spacers 121 can be formed on sides of gate electrode 110.

In FIG. 1A, the DDC transistor 100 is shown as an N-channel transistor having a source 112 and drain 114 made of N-type dopant material, formed upon a substrate such as a P-type doped silicon substrate providing a P-well 122 formed on a substrate 124. In addition, the N-channel DDC transistor in FIG. 1A includes a highly doped screening region 126 made of P-type dopant material, and a threshold voltage set region 128 made of P-type dopant material. Screening region 126 can be biased via a body tap 130. It will be understood that, with appropriate changes to dopant materials, a P-channel DDC transistor can be formed.

Figure 1B:
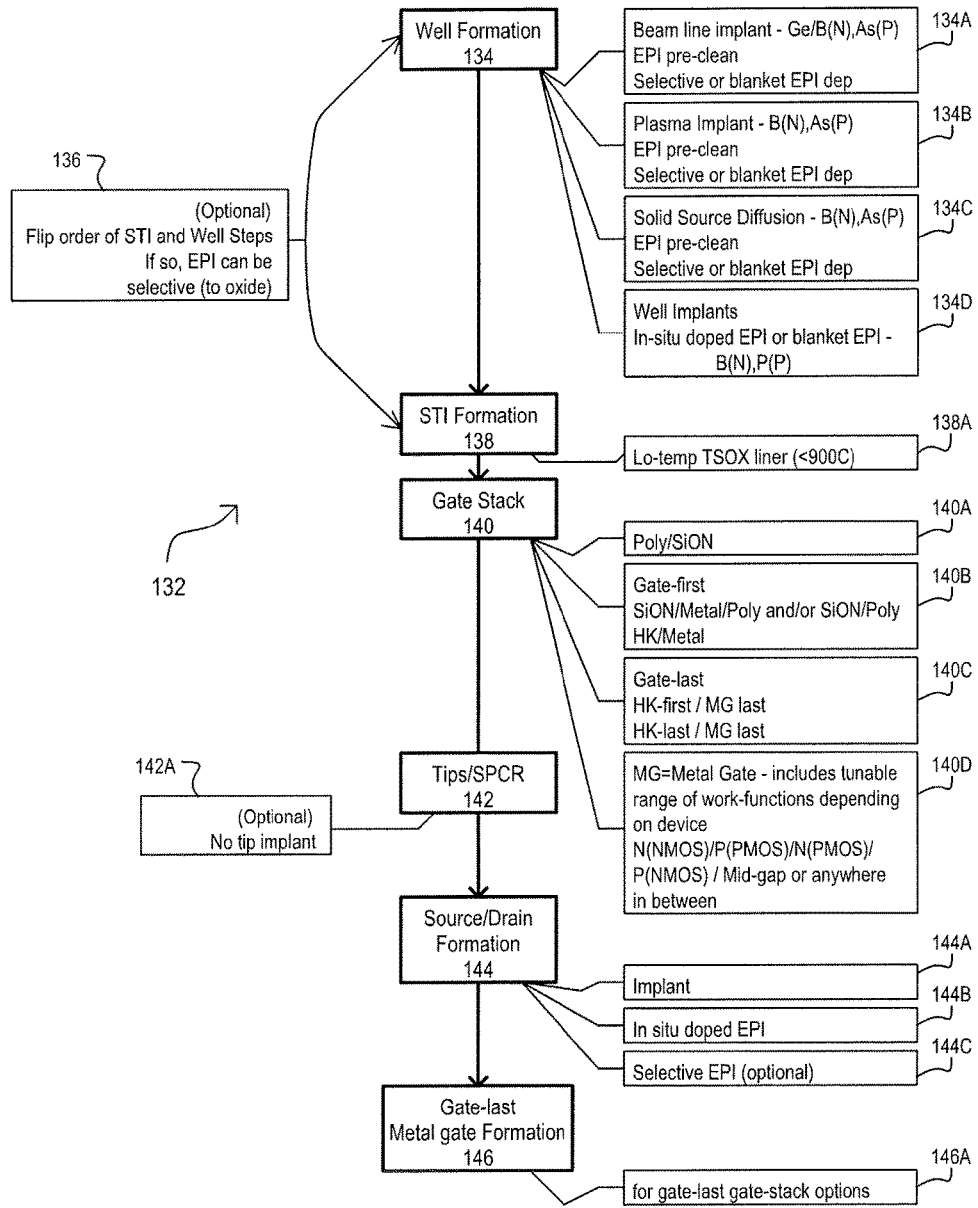
FIG. 1B is a flow diagram illustrating a general method for forming a DDC transistor.

FIG. 1B is a flow diagram 132 illustrating a general method for forming a DDC transistor having an enhanced body coefficient and reduced a Vt, in accordance with the various embodiments described herein. The process illustrated in FIG. 1B is intended to be general and broad in its description, and more detailed embodiments and examples are set forth below. Each block in the flow diagram is illustrated and described in further detail below, in conjunction with the various alternatives associated with each block illustrated in FIG. 1B.

In step 134, the process begins at well formation, which can include one or more different process steps in accordance with different embodiments. The well formation step 134 includes the steps for forming the screening region 126, the threshold voltage set region 128 (if present), and the substantially undoped channel 118. As indicated by 136, the well formation 134 can be before or after STI (shallow trench isolation) formation 138.

The well formation 134 can include forming the screening region 126 by implanting dopants into the P-well 122, followed by an epitaxial (EPI) pre-clean process that is followed by a blanket or selective EPI deposition. Various alternatives for performing these steps are illustrated in FIG. 1B. In accordance with one embodiment, well formation 134 can include a beam line implant of Ge/B (N), As (P), followed by an epitaxial (EPI) pre-clean process, and followed by a non-selective blanket EPI deposition, as shown in 134A.

Alternatively, the well formation 134 can include using a plasma implant of B (N), As (P), followed by an EPI pre-clean, then a non-selective (blanket) EPI deposition, as shown in 134B. The well formation 134 can alternatively include a solid-source diffusion of B(N), As(P), followed by an EPI pre-clean, and followed by a non-selective (blanket) EPI deposition, as shown in 134C. As yet another alternative, well formation 134 can also include well implants, followed by in-situ doped selective EPI of B (N), P (P) as shown in 134D. As will be described further below, the well formation can be configured with different types of devices in mind, including DDC transistors, legacy transistors, high VT transistors, low VT transistors, improved ° VT transistors, and standard or legacy aVT transistors. Embodiments described herein allow for any one of a number of devices configured on a common substrate with different well structures and according to different parameters.

In step 134, Boron (B), Indium (I), or other P-type materials can be used for P-type implants, and arsenic (As), antimony (Sb) or phosphorous (P) and other N-type materials can be used for N-type implants. In certain embodiments, the screening region 126 can have a dopant concentration between about $5\times10^{18}$ to $1\times10^{20}$ dopant atoms/cm$^3$, with the selected dopant concentration dependent on the desired threshold voltage as well as other desired transistor characteristics. A germanium (Ge), carbon (C), or other dopant migration resistant layer can be incorporated above the screening region to reduce upward migration of dopants. The dopant migration resistant layer can be formed by way of ion implantation, in-situ doped epitaxial growth or other process. In certain embodiments, a dopant migration resistant layer can also be incorporated to reduce downward migration of dopants.

In certain embodiments of the DDC transistor, a threshold voltage set region 128 is positioned above the screening region 126. The threshold voltage set region 128 can be either adjacent to, incorporated within or vertically offset from the screening region. In certain embodiments, the threshold voltage set region 128 is formed by delta doping, controlled in-situ deposition, or atomic layer deposition. In alternative embodiments, the threshold voltage set region 126 can be formed by way of controlled outdiffusion of dopant material from the screening region 126 into an undoped epitaxial layer, or by way of a separate implantation into the substrate following formation of the screening region 126, before the undoped epitaxial layer is formed. Setting of the threshold voltage for the transistor is implemented by suitably selecting dopant concentration and thickness of the threshold voltage set region 128, as well as maintaining a separation of the threshold voltage set region 128 from the gate dielectric 116, leaving a substantially undoped channel layer directly adjacent to the gate dielectric 116. In certain embodiments, the threshold voltage set region 128 can have a dopant concentration between about $1\times10^{18}$ dopant atoms/cm$^3$ and about $1\times10^{19}$ dopant atoms per cm$^3$. In alternative embodiments, the threshold voltage set region 128 can have a dopant concentration that is approximately less than half of the concentration of dopants in the screening region 126.

In certain embodiments, an over-layer of the channel is formed above the screening region 126 and threshold voltage set region 128 by way of a blanket or selective EPI deposition (as shown in the alternatives shown in 134A-D), to result in a substantially undoped channel region 118 of a thickness tailored to the technical specifications of the device. As a general matter, the thickness of the substantially undoped channel region 118 ranges from approximately 5-25 nm, with the selected thickness based upon the desired threshold voltage for the transistor. Preferably, a blanket EPI deposition step is performed after forming the screening region 126, and the threshold voltage setting region 128 is formed by controlled outdiffusion of dopants from the screening region 126 into a portion of the blanket EPI layer, as described below. Dopant migration resistant layers of C, Ge, or the like can be utilized as needed to prevent dopant migration from the threshold voltage set region 128 into the substantially undoped channel region 118, or alternatively from the screening region 126 into the threshold voltage set region 128.

In addition to using dopant migration resistant layers, other techniques can be used to reduce upward migration of dopants from the screening region 126 and the threshold voltage set region 128, including but not limited to low temperature processing, selection or substitution of low migration dopants such as antimony or indium, low temperature or flash annealing to reduce interstitial dopant migration, or any other technique to reduce movement of dopant atoms can be used.

As described above, the substantially undoped channel region 118 is positioned above the threshold voltage set region 128. Preferably, the substantially undoped channel region 118 has a dopant concentration less than $5\times10^{17}$ dopant atoms per cm$^3$ adjacent or near the gate dielectric 116. In some embodiments, the substantially undoped channel region 118 can have a dopant concentration that is specified to be approximately less than one tenth of the dopant concentration in the screening region 126. In still other embodiments, depending on the transistor characteristics desired, the substantially undoped channel region 118 may contain dopants so that the dopant concentration is elevated to above $5\times10^{17}$ dopant atoms per cm$^3$ adjacent or near the gate dielectric 116 or by using a very light dose of halo implants. Preferably, the substantially undoped channel region 118 remains substantially undoped by avoiding the use of high dosage halo or other channel implants.

Referring still to FIG. 1B, STI formation 138, which, again, can occur before or after well formation 134, can include a low temperature trench sacrificial oxide (TSOX) liner, which is formed at a temperature lower than 900° C. as shown by 138A. Embodiments that form the STI structures after the blanket EPI deposition step, using a process that remains within a low thermal budget, can reduce dopant migration from the previously formed screening region 126 and threshold voltage setting region 128.

As shown in step 140 (FIG. 1B), a gate stack can be formed or otherwise constructed above the substantially undoped channel region 118 in a number of different ways, from different materials, and of different work functions. One option is a polysilicon(Poly)/SiON gate stack 140A. Another option is a gate-first process 140B that includes SiON/Metal/Poly and/or SiON/Poly, followed by High-K/Metal Gate. Another option, a gate-last process 140C includes a high-K/metal gate stack wherein the gate stack can either be formed with "Hi-K first-Metal gate last" flow or and "Hi-K last-Metal gate last" flow. Yet another option, 140D is a metal gate that includes a tunable range of work functions depending on the device construction. Preferably, the metal gate materials for n-channel MOS (NMOS) and p-channel MOS (PMOS) are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices.

A gate stack may be formed or otherwise constructed above the substantially undoped channel region 118 in a number of different ways, from different materials including polysilicon and metals to form what is known as "high-k metal gate". The metal gate process flow may be "gate 1st" or "gate last". Preferably, the metal gate materials for NMOS and PMOS are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices. Following formation of the gate stack, source/drain portions may be formed. Typically, the extension portions are implanted, followed by additional spacer formation and then implant or, alternatively, selective epitaxial deposition of deep source/drain regions.

In step 142, Source/Drain tips can be implanted. The dimensions of the tips can be varied as required, and will depend in part on whether gate spacers (SPCR) are used. In one embodiment, Source/Drain tips are not formed (step 142A), and there may be no tip implant.

In step 144, the source 112 and drain 114 can be formed preferably using conventional processes and materials such as ion implantation (144A) and in-situ doped epitaxial deposition (144B). Optionally, as shown in step 144C, PMOS or NMOS selective EPI layers can be formed in the source and drain regions as performance enhancers for strained channels. Source 112 and drain 114 can further include raised and/or recessed source/drains, asymmetrically doped, counter-doped or crystal structure modified source/drains, or implant doping of source/drain extension regions according to LDD (lightly doped drain) techniques, provided that the thermal budget for any anneal steps be within the boundaries of what is required to keep the screening region 126 and threshold voltage setting region 128 substantially intact.

In step 146, a metal gate is formed in accordance with a gate last process. Step 146 is optional and may be performed only for gate-last processes (146A).

Referring back to FIG. 1A, the channel 118 contacts and extends between the source 112 and the drain 114, and supports movement of mobile charge carriers between the source and the drain. In operation, when gate electrode voltage is applied to the DDC transistor 100 at a predetermined level, a depletion region formed in the substantially undoped channel 118 can extend to the screening region 126, since channel depletion depth is a function of the integrated charge from dopants in the doped channel lattice, and the substantially undoped channel 118 has very few dopants. The screening region 126, if fabricated according to specification, effectively pins the depletion region to define the depletion zone width.

As will also be appreciated, position, concentration, and thickness of the screening region 126 can be important factors in the design of the DDC transistor. In certain embodiments, the screening region 126 is located above the bottom of the source and drain junctions. A screening region 126 can be doped to cause a peak dopant concentration to define the edge of the depletion width when the transistor is turned on. Such a doping of a screening region 126 can include methods such as delta doping, broad dopant implants, or in-situ doping is preferred, since the screening region 126 should have a finite thickness to enable the screening region 126 to adequately screen the well below, while avoiding creating a path for excessive junction leakage. When transistors are configured to have such screening regions, the transistor can simultaneously have good threshold voltage matching, high output resistance, low junction leakage, good short channel effects, and still have an independently controllable body due to a strong body effect. In addition, multiple DDC transistors having different threshold voltages can be easily implemented by customizing the position, thickness, and dopant concentration of the threshold voltage set region 128 and/or the screening region 126 while at the same time achieving a reduction in the threshold voltage variation.

In one embodiment, the screening region is positioned such that the top surface of the screening region is located approximately at a distance of Lg/1.5 to Lg/5 below the gate (where Lg is the gate length). In one embodiment, the threshold voltage set region has a dopant concentration that is approximately 1/10 of the screening region dopant concentration. In certain embodiments, the threshold voltage set region is thin so that the combination of the threshold voltage set region and the screening region is located approximately within a distance of Lg/1.5 to Lg/5 below the gate.

Modifying threshold voltage by use of a threshold voltage set region 128 positioned above the screening region 126 and below the substantially undoped channel 118 is an alternative technique to conventional threshold voltage implants for adjusting threshold voltage. Care must be taken to prevent dopant migration into the substantially undoped channel 118, and use of low temperature anneals and anti-migration materials such as carbon or germanium can be included in embodiments. More information about the formation of the threshold voltage set region 128 and the DDC transistor is found in pending U.S. patent application Ser. No. 12/895,785 filed Sep. 30, 2010, published as U.S. Patent Publication 2011/0079861 A1 on Apr. 7, 2011, the entirety of which disclosure is herein incorporated by reference.

Yet another technique for modifying threshold voltage relies on selection of a gate material having a suitable work function. The gate electrode 110 can be formed from conventional materials, preferably including, but not limited to, metals, metal alloys, metal nitrides and metal silicides, as well as laminates thereof and composites thereof. In certain embodiments the gate electrode 110 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 110 can include silicide methods, chemical vapor deposition methods and physical vapor deposition methods, such as, but not limited to, evaporative methods and sputtering methods. Typically, the gate electrode 110 has an overall thickness from about 1 to about 500 nanometers. In certain embodiments, metals having a work function intermediate between band edge and mid-gap can be selected. As discussed in pending U.S. patent application Ser. No. 12/960,266 filed Dec. 3, 2010, issued as U.S. Pat. No. 8,569,128 on Oct. 29, 2013, the entirety of which disclosure is herein incorporated by reference, such metal gates simplify swapping of PMOS and NMOS gate metals to allow a reduction in mask steps and different required metal types for systems on a chip or other die supporting multiple transistor types.

Applied bias to the screening region 126 is yet another technique for modifying threshold voltage of a DDC transistor 100. The screening region 126 sets the body effect for the transistor and allows for a higher body effect than is found in conventional FET technologies. For example, a body tap 130 to the screening region 126 of the DDC transistor can be formed in order to provide further control of threshold voltage. The applied bias can be either reverse or forward biased, and can result in significant changes to threshold voltage. Bias can be static or dynamic, and can be applied to isolated transistors, or to groups of transistors that share a common well. Biasing can be static to set threshold voltage at a fixed set point, or dynamic, to adjust to changes in transistor operating conditions or requirements. Various suitable biasing techniques are disclosed in U.S. Pat. No. 8,273,617 issued Sep. 25, 2012, the entirety of which disclosure is herein incorporated by reference.

Advantageously, DDC transistors created in accordance with the foregoing embodiments, structures, and processes, can have a reduced mismatch arising from scattered or random dopant variations as compared to conventional MOS transistors. In certain embodiments, the reduced variation results from the adoption of structures such as the screening region, the optional threshold voltage set region, and the epitaxially grown channel region. In certain alternative embodiments, mismatch between DDC transistors can be reduced by implanting the screening layer across multiple DDC transistors before the creation of transistor isolation structures, and forming the channel layer as a blanket epitaxial layer that is grown before the creation of transistor epitaxial structures. In certain embodiments, the screening region has a substantially uniform concentration of dopants in a lateral plane. The DDC transistor can be formed using a semiconductor process having a thermal budget that allows for a reasonable throughput while managing the diffusivities of the dopants in the channel. Further examples of transistor structure and manufacture suitable for use in DDC transistors are disclosed in U.S. Pat. No. 8,273,617 (previously mentioned above) as well as U.S. patent application Ser. No. 12/971,884, filed on Dec. 17, 2010 and issued as U.S. Pat. No. 8,530,286 on Sep. 10, 2013, and U.S. patent application Ser. No. 12/971,955 filed on Dec. 17, 2010 and issued as U.S. Pat. No. 8,759,872 on Jun. 24, 2014, the respective contents of which are incorporated by reference herein.

FIG. 1A shows an embodiment of a Deeply Depleted Channel (DDC) transistor 100 that is configured to have an enhanced body coefficient, along with the ability to set threshold voltage Vt with enhanced precision. A DDC transistor 100 includes a gate electrode 110, source 112, drain 114, and a gate dielectric 116 positioned over a substantially undoped channel 118.

Figure 2A:
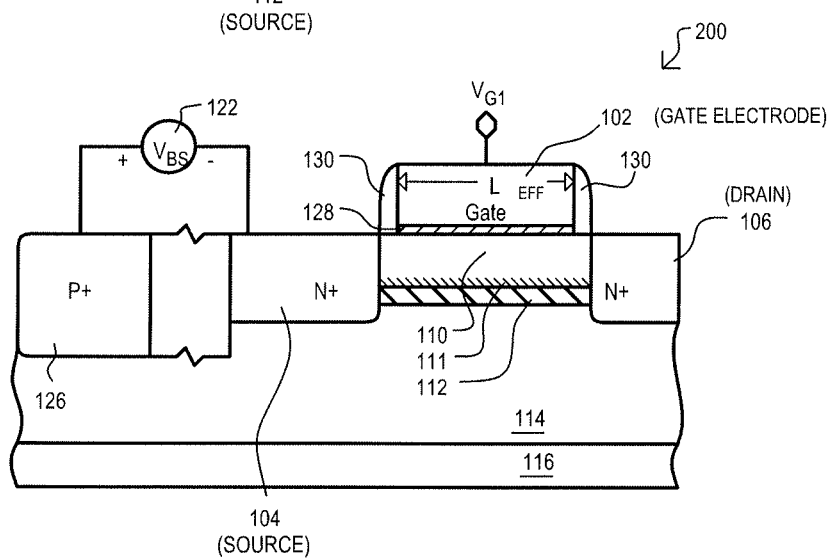
FIG. 2A shows a tipless DDC transistor according to an embodiment.

FIG. 2A illustrates a tipless DDC transistor 200 that does not have lightly doped source and drain extensions (SDEs), in accordance with one embodiment. The tipless DDC transistor 200 is substantially similar to the DDC transistor 100 (of FIG. 1A) with regard to aspects other than the SDEs. The tipless DDC transistor 200 has a weaker drive current (alternatively described as having a weaker drive strength) than a DDC transistor 100 for a substantially similar drawn gate length, at least in part because the effective gate length ($L_{EFF}$) of the DDC transistor is longer as a result of the absence of the SDEs.

Figure 2B:
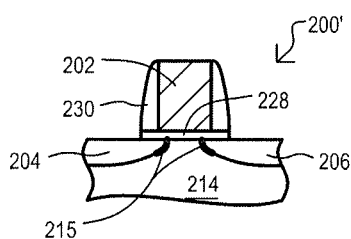
FIGS. 2B and 2C show tipless transistors that can be included in embodiments.

FIG. 2B shows another tipless transistor 200' that can be included in embodiments. A tipless transistor 200' can be a non-DDC transistor with source and drain diffusion profiles (204/206). As shown, while source and drains (204/206) may extend under a small portion of a gate electrode 202, there are no lateral extensions from vertical profiles 215 of such regions.

Figure 2C:
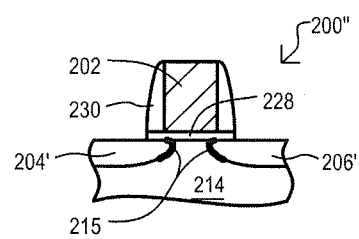

FIG. 2C shows a further tipless transistor 200" that can be included in embodiments. Again, while source and drains (204/206) may extend under a small portion of a gate electrode 202, there are no lateral extensions from vertical profiles 215 of such regions.

Figure 2D:
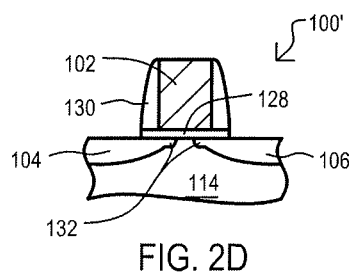
FIG. 2D shows a transistor with source-drain extensions (SDE transistors).

FIG. 2D shows a transistor 100' like that of FIGS. 2B and 2C, but with SDEs 132. That is, transistor 100' of FIG. 2D is not tipless.

Figures 0, 12A:
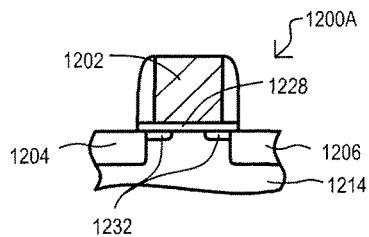
FIGS. 12A-0 to 12B-1 show transistors that can be included in embodiments.
Figures 0, 12B:
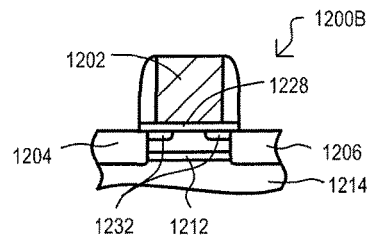
Figures 1, 12A:
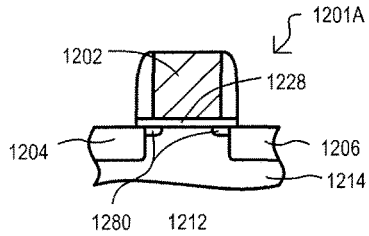
Figures 1, 12B:
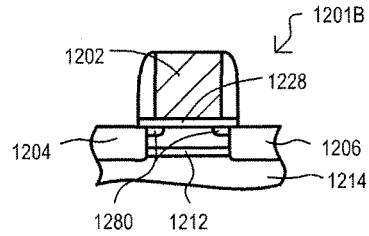

It is understood that while FIGS. 1 to 2D are provided to contrast tipless transistors with those that include source/drain extensions, such figures are exemplary. One skilled in the art would understand diffusion profiles could take various forms.

Various embodiments of circuits described below make reference to tipless transistors (NMOS and PMOS). For the embodiments described below, preferably, a tipless transistor is implemented either as a tipless-DDC transistor or variant of a DDC transistor, though the embodiments can also be understood in reference to any non-DDC tipless transistor (e.g., a legacy or other MOSFET without SDEs). Various embodiments of circuits described below also make reference to SDE transistors (NMOS and PMOS). For the embodiments described below, a SDE transistor can be implemented as either a DDC transistor having SDEs or a non-DDC transistor having SDEs. Similarly, for the embodiments described below, SDE inverters and SDE logic gates refer to inverters and logic gates that can be implemented using either DDC transistors having SDEs or non-DDC transistors having SDEs.

FIG. 3A illustrates a tipless inverter circuit 300 that uses a tipless NMOS transistor 308-1 and a tipless PMOS transistor 308-0, in accordance with one embodiment. It is understood that tipless inverter circuit 300 can be included in a larger integrated circuit device having other transistors of smaller sizes, including those having gate lengths of less than one micron, less than 0.5 micron, or less than 0.25 microns.

In certain embodiments, the tipless NMOS transistor 308-1 can be either a tipless NMOS DDC transistor or a tipless non-DDC NMOS transistor. In alternative embodiments, the tipless PMOS transistor 308-0 can be either a tipless PMOS DDC transistor or a tipless non-DDC PMOS transistor. PMOS transistor 308-0 can have a source-drain path connected between a high power supply node VDD and output node 309. NMOS transistor 308-1 can have a source-drain path connected between a low power supply node VSS and output node 309. Gates of transistors (308-0/1) can be commonly connected to input node 311. As will be noted in more detail below, in some embodiments, both NMOS and PMOS transistors 308-0/1 can be tipless transistors. In other embodiments, one transistor 308-0 or 308-1 can be a tipless transistor while the other 308-1 or 308-0 can be a transistor with SDE (an SDE transistor).

FIG. 3B illustrates a symbol 305 that is used to represent a tipless inverter 300 like that of FIG. 3A. The tipless inverter 305 can have a longer rise and/or fall delay time than an inverter formed with SDE transistors with substantially similar sized transistor. In one embodiment, a tipless inverter 305 using a tipless NMOS transistor and a SDE PMOS transistor can provide a longer fall delay time than a SDE inverter with NMOS and PMOS transistors of substantially equal drawn size, while providing a substantially equal rise delay time for the two inverters. In an alternative embodiment, a tipless inverter using a SDE NMOS transistor and a tipless PMOS transistor can provide a longer rise delay time than a SDE inverter with NMOS and PMOS transistors of substantially equal drawn size, while providing a substantially equal fall delay time for the two inverters.

According to embodiments herein, in integrated circuits having smaller geometry transistors, tipless transistors can be used to implement logic gates (e.g., NAND, NOR, etc.), buffers, and inverters, the tipless transistors giving rise to an increased delay. In one embodiment, a tipless inverter can have the same area (i.e., have transistors of the same drawn size) as an SDE inverter, but the tipless inverter can have an increased delay. Therefore, if an inverter with increased delay is required during optimization of timing paths in an integrated circuit, an SDE inverter can be replaced with a tipless inverter having transistors of the same drawn size as the SDE inverter without requiring a layout change or a new place and route step. In one embodiment, the SDE inverter can be replaced with a tipless inverter having substantially identical size and footprint as the SDE inverter by swapping the corresponding cells during a place and route operation.

In alternative embodiments, logic gates using tipless transistors can be used to obtain a desired delay required during timing optimization, where the logic gates using tipless transistors can be substituted for the logic gates using SDE transistors without requiring a layout change or a new place and route step.

FIG. 4A illustrates a pulse generator circuit 400 that uses a tipless inverter 405 as a delay element, in accordance with one embodiment. A pulse generator 400 can include a logic gate circuit 410/415 having one input that receives an input signal (CLK_IN) directly, and another input that receives the input signal via tipless inverter 405. In the very particular embodiment shown, logic gate circuit 410/415 can include a NAND gate 410 and an inverter 415. In one very particular embodiment, NAND gate 410 and inverter 415 can be formed with SDE transistors.

The pulse generator of FIG. 4A is in contrast with a conventional pulse generator circuit formed with all SDE transistors (i.e., an SDE pulse generator circuit). In a conventional SDE pulse generator circuit, a delay element (corresponding to 405 of FIG. 4A) can be formed with an inverter having long channel SDE transistors, or it can use a delay chain consisting of more than one SDE inverter or long channel SDE inverter.

In one embodiment, a pulse generator circuit using tipless inverters, like those according to embodiments, can be smaller than a SDE pulse width generator, because the tipless inverter can require smaller transistor sizes to provide substantially the same delay as the long channel SDE inverter. In an alternative embodiment, pulse generator circuits using delay chains of tipless inverters can have a smaller area than a SDE pulse width generator using delay chains of SDE inverters because a smaller number of tipless inverters can provide a substantially equivalent delay.

FIG. 4B illustrates waveforms for an operation of the tipless pulse generator circuit of FIG. 4A, in accordance with one embodiment. FIG. 4B includes the following waveforms: input signal (CLK_IN) and an output pulse clock (P_CLK_OUT) of the pulse generator 400. The time interval "pulse_delay", corresponding to the time duration between the rising edge of CLK_IN and the rising edge of P_CLK_OUT, can be determined by the delay of the NAND gate 410 and the inverter 415. The width of the pulse clock P_CLK_OUT (pulse_width) can be determined by the delay of the tipless inverter 405. Typically, the width of the pulse clock (pulse_width) must be sufficiently wide for a pulse latch to sample the data.

In an alternative embodiment, a tipless inverter 405 can be implemented using tipless DDC transistors, which can have a reduced σVT (variation in threshold voltage), resulting in reduced variation for the delay provided by the tipless inverter 405, as well as reduced variation of the pulse width. Therefore, the pulse width generator using tipless DDC transistors can be designed to provide a narrower pulse width (as Vt variation from non-DDC transistors would provide too much variation in pulse width), which allows a better hold time requirement for a circuit (such as a pulse flip-flop) that is being driven by the pulse clock P_CLK_OUT.

FIG. 4C illustrates an enabled tipless pulse generator 430 that uses a tipless inverter 405, in accordance with one embodiment. Enabled pulse generator 430 can have a structure like that of FIG. 4A, but with a logic gate 420/425 having three inputs, a third input receiving an enable signal EN. As in the case of FIG. 4A, NAND gate 420 and inverter 425 can be implemented with SDE transistors. In the embodiment of FIG. 4C, pulses can be generated only when signal EN is active (high in this embodiment).

Figure 5:
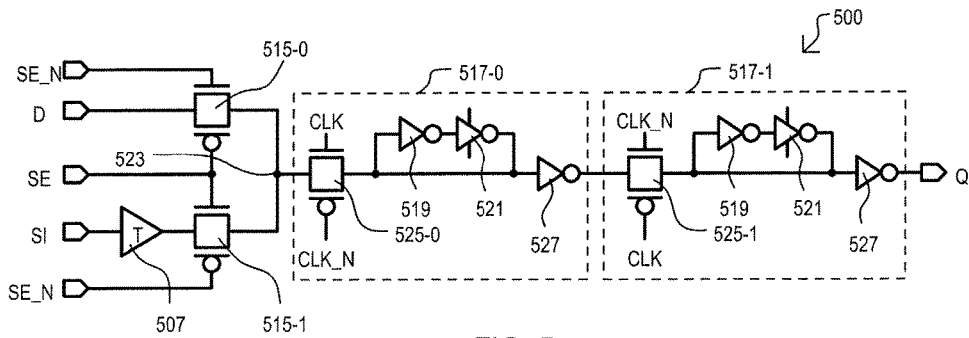
FIG. 5 shows a tipless scannable flip-flop according to an embodiment.

FIG. 5 illustrates a scannable flip-flop 500 that uses a tipless hold buffer 507 as a delay element, in accordance with one embodiment. The tipless hold buffer 507 can be a buffer implemented using one or more tipless transistors, and can provide the advantages discussed above, such as smaller area, lower capacitance, and lower power dissipation as compared to a hold buffer implemented using SDE transistors. A delay provided by the tipless hold buffer 507 can be used to satisfy the hold time requirement of scannable flip-flops 500 that are connected together to form a scan chain, where the output Q of one flip-flop is coupled to the scan input SI of a next flip-flop (not shown) in the scan chain.

Scannable flip-flop 500 can include an input section formed by transfer gates 515-0/1 connected in parallel to input node 523. Transfer gate 515-0 can be enabled when signal SE-N is high and SE is low, to pass value D through to input node 523. Transfer gate 515-1 can be enabled when signal SE-N is low and SE is high, to pass value SI through to input node 523, via tipless hold buffer 507.

Flip-flop 500 can further include clocked latches 517-0/1. Each clocked latch can include an input transfer gate 525-0/1, a feedback path formed with an inverter 519 and a clocked inverter 521, and an output inverter 527. Input transfer gate 525-0 can be oppositely clocked with respect to input transfer gate 525-1. In response to clock signals CLK/CLK_N, data values can be clocked through latches 517-0/1.

Figure 6:
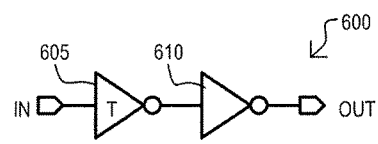
FIG. 6 shows a tipless buffer according to an embodiment.

FIG. 6 illustrates a tipless buffer 600 according to one embodiment. Tipless buffer 600 can include a tipless inverter 605 and a SDE inverter 610, in accordance with one embodiment. In an alternative embodiment, the inverter 610 can also be implemented as a tipless inverter to provide a tipless buffer having additional delay.

Figure 7:
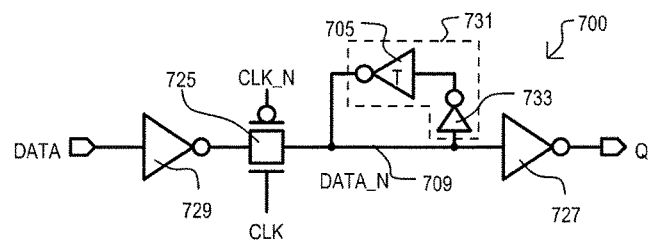
FIG. 7 shows a tipless "jam" latch according to an embodiment.

FIG. 7 illustrates a "jam" latch 700 using a tipless inverter 705, in accordance with one embodiment. Jam latch 700 can include an input inverter 729, an input transfer gate 725, a feedback path 731, and an output inverter 727. A feedback path 731 can include a tipless inverter 705 and a second inverter 733 arranged in series. A tipless inverter 705 can maintain the state of the storage node 709 (labeled "DATA_N") by driving the storage node DATA_N when it is not being driven by the input at node DATA, thereby increasing the noise immunity of the jam latch. Data can be written into the jam latch 700 by overpowering or "jamming" the tipless inverter 705 during the write cycle (i.e., forcing the tipless inverter 705 to drive its output in an opposite direction). A jam latch 700 can operate without a clock controlling the feedback path 731, and thus can reduce the clock loading in an integrated circuit using the jam latch.

In addition, the jam latch 700 can dispense with the generation of complicated control signals to control the operation of the feedback path 731, which can be advantageous, particularly in circuits that can provide more complicated latch functions, e.g., a multiplexing latch.

In one embodiment, the jam latch of FIG. 7 is modified to implement a multiplexing jam latch by replacing the inverter 729, connected between nodes DATA and DATA_N, with a multiplexer having two or more inputs. The tipless inverter 705 can be implemented using tipless transistors, and can provide the advantages discussed above, such as smaller area, lower capacitance, and lower power dissipation as compared to a feedback inverter implemented using SDE transistors (e.g., long channel transistors that are used to provide a feedback inverter with weak drive strength).

Figure 8:
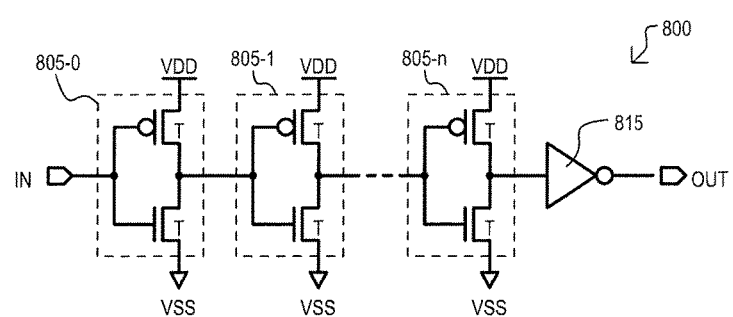
FIG. 8 shows a tipless hold buffer according to an embodiment.

FIG. 8 illustrates a tipless hold buffer 800 in accordance with one embodiment. Tipless hold buffer 800 can include a number of tipless inverters (805-0 to -n) arranged in series with one another as delay elements. In the very particular embodiment shown, hold buffer 800 can have an odd number of tipless inverters (805-0 to -n), followed by a SDE inverter 815 that drives the output node OUT. The SDE inverter 815 can be implemented using either DDC or non-DDC transistors having SDEs. The tipless hold buffer 800 can have a smaller size than a hold buffer using SDE transistors that implement the delay elements using long channel transistors, since a tipless inverter (805-0 to -n) can provide substantially the same delay using transistors having a smaller drawn size than the long channel transistors.

Figure 9:
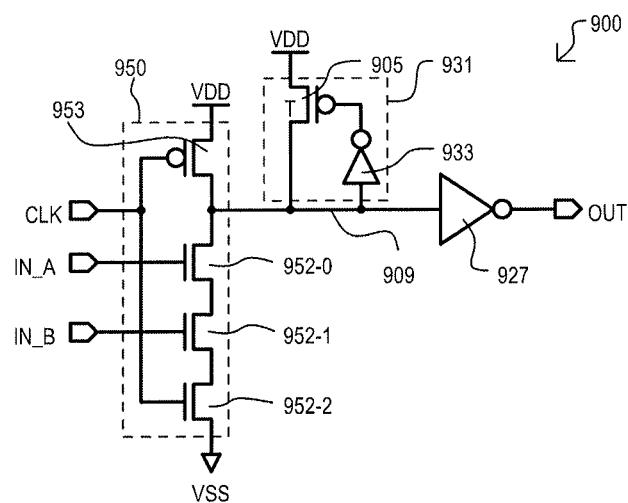
FIG. 9 shows a tipless domino logic gate according to an embodiment.

FIG. 9 illustrates a tipless domino logic gate 900 using a PMOS tipless transistor 905 as a keeper device, in accordance with one embodiment. A tipless domino logic gate 900 can include a logic input section 950 that drives a storage node 909 in response to input signals, a feedback path 931, and an output inverter 927. In the very particular embodiment shown, an input section 950 can include a transistor of a first conductivity type 953 (PMOS in this embodiment) having a source-drain path connected between a high power supply node VDD and storage node 909, and a number of transistors of a second conductivity type (952-0 to -2) (NMOS in this embodiment) having source-drain paths connected in series between storage node 909 and a second power supply node VSS. When a clock signal CLK is low, transistor 953 can drive storage node 909 high. When clock signal CLK is high, transistor 952-2 can be enabled, and storage node 909 may, or may not, be discharged to VSS through transistor 952-2, depending upon logic signals applied to gates of transistors 952-0/1.

To provide pseudo-static operation, i.e., make the circuit functional when no clock is applied, the tipless transistor 905 functions as a feedback device that supplies current to counteract the leakage current of the NMOS stack (952-0/1/2). Thus, the leakage current will not discharge the domino circuit if the storage node 909 should remain high. A drive strength of tipless transistor 901 can be selected to ensure that tipless transistor 905 is not so strong so as to make the logic gate 900 unwritable, i.e., the NMOS is not strong enough to discharge storage node 909 when the clock (CLK) is high. This can occur when process variations result in weak NMOS and strong PMOS devices (i.e., a weak NMOS, strong PMOS "corner").

The tipless domino logic gate 900 is in contrast to a conventional SDE domino logic gate, which can use a long channel SDE transistor as the keeper or feedback device. In a conventional SDE domino logic gate the long channel SDE transistor is typically strong enough to counteract the NMOS stack leakage current while also being weak enough to allow the storage node 909 to be discharged by the NMOS stack when the clock is active.

The tipless domino logic gate 900 can be smaller than the SDE domino logic gate because the PMOS tipless transistor 905 can provide a weak feedback using a smaller drawn transistor size than a comparable long channel SDE transistor having substantially similar drive strength.

Figure 10:
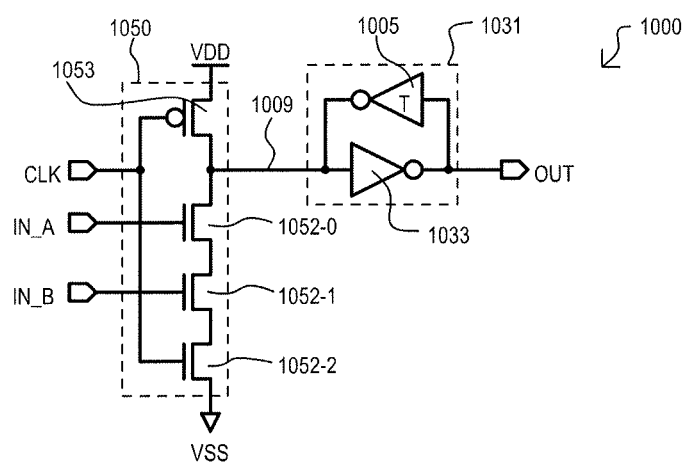
FIG. 10 shows a tipless domino logic gate according to another embodiment.

FIG. 10 illustrates a tipless domino logic gate 1000 using a tipless inverter 1005 as a keeper, in accordance with one embodiment. Tipless domino logic gate 1000 can include sections like those of FIG. 9, and such like sections have the same reference character, but with the leading digits being 10 instead of 9. FIG. 10 differs from FIG. 9 in that a feedback path can include an inverter 1033 and tipless inverter 1005, with inverter 1033 being connected between a storage node 1009 and an output node OUT.

The tipless inverter 1005 functions as a feedback device that can counteract the leakage current of the NMOS stack (1052-0/1/2) when the clock is not active, i.e. the clock signal (CLK) voltage is at "0" or "VSS", so that the leakage current does not change the state of the storage node 1009 when it is at high or VDD. The tipless inverter 1005 can also provide a weak feedback device that allows the storage node 1009 to be discharged by the NMOS stack (1052-0/1/2) when the clock is active and IN_A and IN_B are high.

The tipless domino logic gate 1000 is in contrast with a conventional SDE domino logic gate, which can use a long channel inverter as the feedback device, where the long channel inverter is implemented using long channel SDE transistors that are weaker than the SDE transistors in a corresponding NMOS stack.

The tipless domino gate 1000 can be smaller than the SDE domino gate because the tipless inverter 1005 can provide a weak feedback using smaller transistor sizes, as drawn, than the long channel transistors of a comparable long channel SDE inverter having substantially similar drive strength.

According to embodiments, a tipless inverter, or other tipless delay circuit as described herein, can be used to advantageously implement programmable delay chains in integrated circuit devices. Since a tipless inverter/delay circuit can have a longer delay than a SDE inverter/delay circuit using similarly sized transistors, a programmable delay chain using tipless devices can have fewer stages (e.g., inverters) than a programmable delay chain using SDE inverters to provide a predetermined delay. The programmable delay chain using tipless transistors can have a lower capacitance as a result of having fewer inverters, and therefore, it can have lower power dissipation than a programmable delay chain with SDE inverters. The programmable delay chain using tipless inverters can also have a smaller area since it can provide the predetermined delay using fewer inverter stages. In alternative embodiments, the area, delay, power dissipation, and leakage of the programmable delay chain can be adjusted to have a predetermined value that is determined by the selection of the source/drain extension tip length for the transistors used in the programmable delay chain.

Programmable delay chains according to embodiments can be included in various integrated circuit devices. One such embodiment is shown in FIG. 11.

Figure 11:
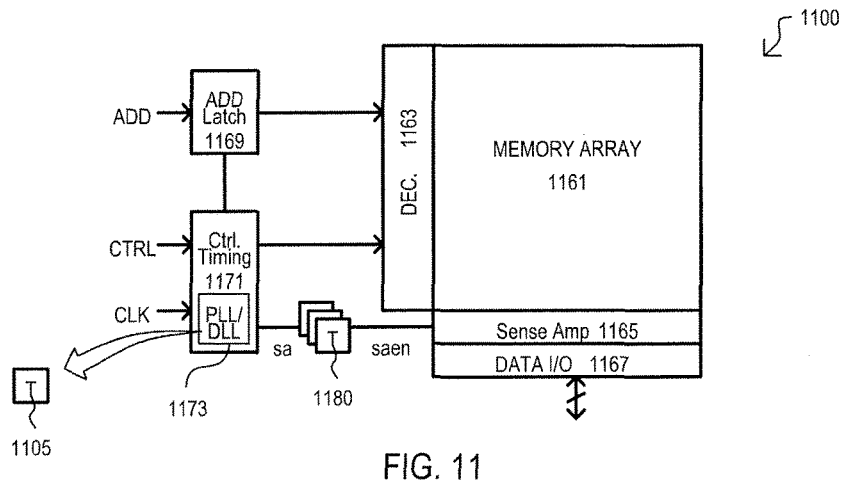
FIG. 11 shows a memory device according to an embodiment.

FIG. 11 illustrates an integrated circuit memory device 1100 according to an embodiment. A memory device 1100 can include a memory array 1161, decoder circuits 1163, sense amplifier circuits 1165, a data input/output (I/O) section 1167, an address latch 1169, and a timing and control circuit 1171. A memory array 1161 can include memory cells for storing data, including but not limited to: dynamic random access memory (DRAM) cells, static RAM (SRAM) cells, and/or nonvolatile memory cells. Decoder circuits 1163 can decode addresses to access memory cells. I/O section 1167 can provide data read and write (program) paths for memory cell array. Address latch 1169 can store received address values (ADD). Control circuit 1171 can generate timing and control signals based on received control data, and in the particular embodiment shown, a clock signal CLK.

Sense amplifier circuits 1165 can amplify signals from memory cells to generate read data values for output from the memory device 1100. In the embodiment shown, sense amplifier circuits 1165 can be activated in response to a sense amplifier enable signal (saen). In high performance memory devices, the timing of a saen signal can be adjusted to optimize performance.

In the embodiment shown, control circuit 1171 can generate a sense amplifier signal (sa) in response to timing signals and read control signals (e.g., read commands). A sense amplifier signal (sa) can be delayed by a tipless programmable delay chain 1180, to generate the saen signal. A tipless programmable delay chain 1180 can take the form of any of those shown herein, or equivalents. A tipless programmable delay chain 1180 can provide a desired delay with a smaller size, lower power consumption, and fewer stages than a conventional SDE delay circuit.

According to embodiments, a tipless inverter or other tipless delay circuit can also be used as delay elements in a clock modification or generation circuit, such as a delay locked loop (DLL) or phase locked loop (PLL). As in the case of tipless programmable delay chains, the inclusion of tipless delay circuits in DLL or PLL like circuits can allow for fewer delay stages, for lower power dissipation, as well as smaller area. Tipless DLL/PLL type circuits according to embodiments can be included in various integrated circuit devices. One such embodiment is shown in FIG. 11.

Referring once again to FIG. 11, a memory device 1100 can include a control circuit 1171 to generate timing and control signals. In the embodiment shown, control circuit 1171 can include a PLL and/or DLL 1173 for generating timing signals having a desired phase or frequency shift with respect to another clock signal (i.e., CLK). The PLL/DLL circuit 1173 can include tipless delay elements 1105, in the form of tipless transistors, inverters, pulse generators, etc.

While embodiments above have shown the inclusion of tipless transistors in integrated circuit devices, alternate embodiments can utilize "short-tip" transistors in addition to, or as a substitute for, tipless transistors.

Accordingly, alternate embodiments can include any of the circuits described with reference to FIGS. 3A-11, where any or all tipless transistors/circuits are substituted with short-tip transistors. For these alternative circuit embodiments, a short-tip transistor can be implemented either as a DDC or a non-DDC transistor with shorter SDEs than a conventional SDE transistor. The short-tip transistor can have an intermediate drive strength that is weaker than a SDE transistor and stronger than a tipless transistor, where each of the transistors has substantially similar drawn size. In other embodiments, the length of the SDEs for the short-tip transistors can be selected to obtain a predetermined delay required for the circuits described above. For example, the SDE lengths of the short-tip transistors in the short-tip inverter can be selected to provide predetermined rise and fall delay times without modifying the drawn sizes of the short-tip transistors. Therefore, if an inverter with a predetermined delay is required during optimization of timing paths in an integrated circuit, an SDE inverter can be replaced with a short-tip inverter having transistors with appropriately selected SDE lengths without requiring a layout change or a new place and route step, where both inverters have transistors with substantially similar drawn sizes.

FIG. 12A-0 illustrates a conventional SDE transistor 1200A formed in a substrate 1214, having a gate electrode 1202, gate insulator 1228, source 1204, drain 1206, and SDEs 1232.

FIG. 12A-1 illustrates a short-tip transistor 1201A formed in a substrate 1214, having a gate electrode 1202, gate insulator 1228, source 1204, drain 1206, and short-tip SDEs 1280. Short tip SDEs 1280 can extend to a lesser extent in a lateral direction than conventional SDEs 1232 in FIG. 12A-0.

FIG. 12B-0 illustrates a DDC transistor 1200B formed in a substrate 1214, having a gate electrode 1202, gate insulator 1228, source 1204, drain 1206, and SDEs 1232.

FIG. 12B-1 illustrates a short-tip DDC transistor 1201B formed in a substrate 1214, having a gate electrode 1202, gate insulator 1228, source 1204, drain 1206, and short-tip SDEs 1280. Short tip SDEs 1280 can extend to a lesser extent in the lateral direction than conventional SDEs 1232 in FIG. 12A-0.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit, comprising:
a first deeply depleted channel transistor formed in the substrate and having a first source-drain current path coupled between a first and a second node, the first deeply depleted channel transistor having a first source drain vertical doping profile with a first extension region that extends in a lateral direction under a gate electrode of the first deeply depleted channel transistor, the first deeply depleted channel transistor being configured to selectively couple a first output node to the first or second node in response to one or more input signals, the first deeply depleted channel transistor having a first drawn gate length of less than one micron; and
a second deeply depleted channel transistor formed in the substrate and having a second source-drain current path coupled between the first node and the second node, the second deeply depleted channel transistor having a second source drain vertical doping profile with a second extension region of which dopant concentration is less than dopant concentration of the first extension region, the second deeply depleted channel transistor being configured to selectively couple a second output node to the first or second node in response to the one or more input signals, the second deeply depleted channel transistor having a second drawn gate length of less than one micron and same channel doping profile as a channel doping profile of the first deeply depleted channel transistor.

2. The integrated circuit of claim 1, wherein:
the first deeply depleted channel transistor having a first source and drain having the first source drain vertical doping profile doped to a first conductivity type, a first substantially undoped channel region, and a first highly doped screening region of the second conductivity type formed below the first substantially undoped channel region.

3. The integrated circuit of claim 1, wherein:
the second deeply depleted channel transistor having a second source and drain having the second source drain vertical doping profile doped to a first conductivity type, a second substantially undoped channel region, and a second highly doped screening region of the second conductivity type formed below the second substantially undoped channel region.

4. The integrated circuit of claim 1, further including:
a delay circuit configured to delay an electrical signal and comprising at least the second deeply depleted channel transistor.

5. The integrated circuit of claim 4, further including:
a logic gate configured to logically combine signals at a plurality of gate inputs to generate a gate output signal; and the delay circuit is coupled to a first gate input of the logic gate.

6. The integrated circuit of claim 5, further including:
a pulse generator that includes the logic gate having a second gate input coupled to receive an input signal, and the delay circuit is coupled to receive the input signal and has a delay circuit output coupled to the first gate input.

7. The integrated circuit of claim 6, wherein:
the pulse generator further includes the logic gate having a third gate coupled to receive an enable signal that enables and disables the pulse generator circuit.

8. The integrated circuit of claim 6, further including:
a flip-flop circuit comprising a plurality of latches arranged in series, each latch having a clocked input, passgates coupled in parallel to an input of the flip-flop circuit, and
the delay circuit is coupled to an input of one of the passgates.

9. The integrated circuit of claim 6, further including:
a memory cell array;
sense amplifier circuits coupled to the memory cell array and configured to sense data values from memory cells of the memory cell array, the sense amplifier circuits being enabled in response to a sense amplifier control signal;
a control circuit configured to generate an initial sense amplifier control signal; and
the delay circuit is configured to delay the initial sense amplifier control signal to generate the sense amplifier control signal.

10. The integrated circuit of claim 5, further including:
a timing control circuit configured to generate a periodic timing clock for the integrated circuit, and comprising the delay circuit; wherein
the timing control circuit is selected from the group of: a phase locked loop circuit and a delay locked loop circuit.

11. The integrated circuit of claim 1, wherein:
the first deeply depleted channel transistor has the first drawn gate length of less than 0.5 micron; and
the second deeply depleted channel transistor has the second drawn gate length of less than 0.5 micron.

* * * * *